(12) United States Patent
Palaniswamy et al.

(10) Patent No.: US 9,716,061 B2
(45) Date of Patent: *Jul. 25, 2017

(54) FLEXIBLE LIGHT EMITTING SEMICONDUCTOR DEVICE

(75) Inventors: Ravi Palaniswamy, Singapore (SG); Arokiaraj Jesudoss, Singapore (SG); Alejandro Aldrin Il Agcaoili Narag, Singapore (SG); Siang Sin Foo, Singapore (SG); Fong Liang Tan, Singapore (SG); Wei Meng Pee, Singapore (SG); Andrew J. Ouderkirk, St. Paul, MN (US); Justine A. Mooney, Austin, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/985,096

(22) PCT Filed: Feb. 17, 2012

(86) PCT No.: PCT/US2012/025613
§ 371 (c)(1),
(2), (4) Date: Aug. 13, 2013

(87) PCT Pub. No.: WO2012/112873
PCT Pub. Date: Aug. 23, 2012

(65) Prior Publication Data
US 2013/0320390 A1    Dec. 5, 2013

Related U.S. Application Data

(60) Provisional application No. 61/444,356, filed on Feb. 18, 2011, provisional application No. 61/444,370, (Continued)

(51) Int. Cl.
*H01L 23/498* (2006.01)
*H01L 33/62* (2010.01)
(Continued)

(52) U.S. Cl.
CPC ........ *H01L 23/4985* (2013.01); *H01L 23/498* (2013.01); *H01L 23/49838* (2013.01);
(Continued)

(58) Field of Classification Search
CPC ... H01L 33/486; H01L 33/382; H01L 33/483; H01L 33/48; H01L 33/62; H01L 33/385;
(Continued)

(56) References Cited

U.S. PATENT DOCUMENTS 6,153,298 A    11/2000    Joson
6,153,928 A    11/2000    Cho
(Continued)

FOREIGN PATENT DOCUMENTS

EP    1744736 A2    1/2007
JP    2003-209141    7/2003
(Continued)

OTHER PUBLICATIONS

International Search Report for PCT International Application No. PCT/US2012/025613, Mailed on Nov. 1, 2012, 3 pages.

*Primary Examiner* — Eduardo A Rodela
(74) *Attorney, Agent, or Firm* — Clifton F. Richardson; Melanie G. Gover

(57) ABSTRACT

A flexible polymeric dielectric layer has first and second major surfaces. The first major surface has a conductive layer thereon. The dielectric layer has at least one via extending from the second major surface to the first major surface. The conductive layer includes electrically separated
(Continued)

first and second portions configured to support and electrically connect a light emitting semi-conductor device to the conductive layer.

11 Claims, 7 Drawing Sheets

Related U.S. Application Data filed on Feb. 18, 2011, provisional application No. 61/444,374, filed on Feb. 18, 2011, provisional application No. 61/477,231, filed on Apr. 20, 2011, provisional application No. 61/496,289, filed on Jun. 13, 2011, provisional application No. 61/524,649, filed on Aug. 17, 2011, provisional application No. 61/524,660, filed on Aug. 17, 2011, provisional application No. 61/524,646, filed on Aug. 17, 2011.

(51) Int. Cl.
*H01L 23/00* (2006.01)
*H05K 1/11* (2006.01)
*H01L 33/48* (2010.01)
*H01L 33/64* (2010.01)
*H05K 1/18* (2006.01)

(52) U.S. Cl.
CPC ........ *H01L 23/49872* (2013.01); *H01L 24/17* (2013.01); *H01L 33/62* (2013.01); *H05K 1/112* (2013.01); *H01L 33/486* (2013.01); *H01L 33/641* (2013.01); *H01L 33/647* (2013.01); *H01L 2224/16225* (2013.01); *H01L 2224/48091* (2013.01); *H01L 2924/01322* (2013.01); *H01L 2924/01327* (2013.01); *H01L 2924/12032* (2013.01); *H01L 2924/12041* (2013.01); *H01L 2924/12042* (2013.01); *H01L 2924/1461* (2013.01); *H01L 2924/15747* (2013.01); *H01L 2924/15787* (2013.01); *H01L 2924/181* (2013.01); *H01L 2924/351* (2013.01); *H05K 1/189* (2013.01); *H05K 2201/10106* (2013.01)

(58) Field of Classification Search
CPC ............. H01L 23/498; H01L 23/49805; H01L 23/49822; H01L 23/49827; H01L 23/49838; H01L 23/4985; H01L 23/49861
USPC ...... 257/79, 99, E23.005, E23.007, E23.011, 257/E23.06, E23.065, 6, E23.068, 257/E23.072
See application file for complete search history.

(56) References Cited

U.S. PATENT DOCUMENTS

| | | | |
|---|---|---|---|
| 6,297,598 B1 | 10/2001 | Wang | |
| 6,331,063 B1* | 12/2001 | Kamada et al. | 362/237 |
| 6,531,328 B1* | 3/2003 | Chen | 438/26 |
| 6,614,103 B1* | 9/2003 | Durocher et al. | 257/678 |
| 7,199,400 B2 | 4/2007 | Sasuga | |
| 7,284,894 B2 | 10/2007 | Mok | |
| 7,348,045 B2 | 3/2008 | Yang | |
| 7,354,846 B2 | 4/2008 | Kim | |
| 7,626,208 B2 | 12/2009 | Yang | |
| 7,714,341 B2 | 5/2010 | Chil Keun | |
| 7,745,832 B2 | 6/2010 | Hsieh | |
| 7,763,895 B2 | 7/2010 | Hsiao | |
| 7,800,121 B2* | 9/2010 | Aanegola et al. | 257/98 |
| 7,816,156 B2 | 10/2010 | Choi | |
| 7,871,836 B2 | 1/2011 | Yang | |
| 7,872,277 B2 | 1/2011 | Hsu | |
| 8,101,966 B2* | 1/2012 | Yen | 257/99 |
| 8,138,239 B2 | 3/2012 | Prack et al. | |
| 8,384,121 B2* | 2/2013 | Tischler et al. | 257/99 |
| 2002/0163006 A1* | 11/2002 | Yoganandan | H01L 33/486 257/81 |
| 2005/0247944 A1 | 11/2005 | Haque | |
| 2006/0087866 A1 | 4/2006 | Ng | |
| 2006/0171152 A1* | 8/2006 | Suehiro et al. | 362/363 |
| 2006/0186430 A1 | 8/2006 | Park | |
| 2007/0029569 A1* | 2/2007 | Andrews | 257/99 |
| 2007/0120089 A1 | 5/2007 | Mao | |
| 2008/0067526 A1 | 3/2008 | Chew | |
| 2008/0107863 A1* | 5/2008 | Ikeda | H01L 21/4857 428/137 |
| 2009/0137073 A1 | 5/2009 | Park | |
| 2009/0201699 A1 | 8/2009 | Ohno | |
| 2009/0278162 A1* | 11/2009 | Wang et al. | 257/99 |
| 2009/0311810 A1 | 12/2009 | Yang | |
| 2009/0321778 A1 | 12/2009 | Chen | |
| 2010/0109030 A1 | 5/2010 | Krames | |
| 2010/0148185 A1 | 6/2010 | Hsu | |
| 2010/0155746 A1 | 6/2010 | Ibbetson | |
| 2010/0163897 A1 | 7/2010 | Hsiao | |
| 2010/0252840 A1 | 10/2010 | Ibbetson | |
| 2010/0301493 A1 | 12/2010 | Gallegos | |
| 2011/0031509 A1 | 2/2011 | Kirihara | |
| 2011/0084294 A1 | 4/2011 | Yao | |
| 2012/0002420 A1* | 1/2012 | Imai | H01L 33/486 362/249.02 |
| 2013/0213697 A1* | 8/2013 | Palaniswamy et al. | 174/254 |
| 2014/0036461 A1* | 2/2014 | Palaniswamy | H01L 33/486 361/762 |

FOREIGN PATENT DOCUMENTS

| | | |
|---|---|---|
| JP | 2010-251376 | 11/2010 |
| KR | 2009-0002205 | 1/2009 |
| TW | 200709471 | 3/2007 |
| WO | 2012-061010 | 5/2012 |
| WO | 2012-061182 | 5/2012 |
| WO | 2012-061183 | 5/2012 |
| WO | 2012-061184 | 5/2012 |
| WO | 2012-112310 | 8/2012 |
| WO | 2012-112666 | 8/2012 |
| WO | 2012-112873 | 8/2012 |
| WO | 2013-025402 | 2/2013 |

* cited by examiner

FLEXIBLE LIGHT EMITTING SEMICONDUCTOR DEVICE

TECHNICAL FIELD

This invention relates to flexible high power light emitting semiconductor devices.

BACKGROUND

Conventional light emitting semi-conductor (LES) devices (LESDs), including light emitting diodes (LEDs) and laser diodes, and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by a buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems are greatly increased.

Additionally, conventional LES devices and packages tend to be thick, which limits their uses in low form factor applications. Consequently, there is a continuing need to improve the design of flexible LES devices and packages to improve their thermal dissipation properties, as well as to allow for their use in low form factors.

SUMMARY

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible polymeric dielectric substrate, i.e., a dielectric layer. To accomplish better heat management, LESDs are positioned so they are in close or direct thermal contact with thermally conductive layers by controlling the thickness of the insulator (dielectric) material between the LESD and a thermally conductive layer or by completely removing the insulator material between the LESD and a thermally conductive layer. In at least one embodiment of the present invention, controlled removal, e.g., by etching, of the dielectric substrate to a desired thickness to form a cavity, or creating an opening completely through the dielectric substrate to form a via, is performed.

In at least one aspect, the present invention provides an article including a flexible polymeric dielectric layer having first and second major surfaces. The first major surface has a conductive layer thereon. The dielectric layer has at least one via extending from the second major surface to the first major surface. The conductive layer includes electrically separated first and second portions configured to support and electrically connect a light emitting semiconductor device to the conductive layer.

In at least one aspect, the present invention provides an article including a flexible polymeric dielectric layer having first and second major surfaces. The first and second major surfaces each have a conductive layer thereon. The second major surface has at least one cavity therein. The at least one cavity contains a conductive material that is electrically connected to the conductive layer on the second major surface. The conductive layer on the first major surface includes electrically separated first and second portions configured to support and electrically connect a light emitting semiconductor device to the conductive layer on the first major surface.

In at least one aspect, the present invention provides a flexible article including a polymeric dielectric layer having a first major surface with a first electrically conductive layer thereon and having a second major surface. The dielectric layer has at least one cavity extending from the second major surface toward the first major surface. The first electrically conductive layer includes an electrically conductive feature substantially aligned with the cavity, and a light emitting semiconductor device supported by the electrically conductive feature.

In at least one aspect, the present invention provides a flexible article including a polymeric dielectric layer having a first major surface with a first electrically conductive layer thereon and having a second major surface. The dielectric layer has at least one via extending from the second major surface to the first major surface. The first electrically conductive layer includes an electrically conductive feature substantially aligned with the via, and a light emitting semiconductor device supported by the electrically conductive feature.

In at least one aspect, the present invention provides an article including a flexible dielectric layer having a first major surface with a first conductive layer thereon and having a second major surface. The dielectric layer has at least one cavity, or via, extending from the second major surface toward, or to, the first major surface. The at least one cavity, or via, contains conductive material. The first conductive layer includes a conductive feature substantially aligned with the cavity, or via, and conductive pads disposed adjacent the conductive feature.

In at least one aspect, the present invention provides an article including a flexible dielectric layer having a first major surface with a first conductive layer thereon and having a second major surface. The dielectric layer has two cavities, or vias, extending from the second major surface toward, or to, the first major surface. The two cavities, or vias, contain conductive material. The first conductive layer includes a conductive pad substantially aligned with each cavity, or via.

As used in this application:

"LES" means light emitting semiconductor(s), including light emitting diode(s) and laser diode(s) and "LESD" means light emitting semiconductor device(s), including light emitting diode device(s) and laser diode device(s). An LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions. The term "flexible LES device" or "flexible LESD" typically refers to the flexible article containing the bare die light emitting semiconductor, packaged LES construction, or intermediate LES construction. Examples of the type of complete packaged LES constructions that may be suitable for use in embodiments of the present invention Golden DRAGON LEDs, available from OSRAM Opto Semiconductors GmbH, Germany; LUXION LEDs, available from Philips Lumileds Lighting Company, USA; and XLAMP LEDs, available from Cree, Inc., USA.

An advantage of at least one embodiment of the present invention is:

Excellent thermal dissipation in the x-y direction, i.e., the length and width direction of the flexible substrate, by providing a cavity or via having a large surface area.

The LESDs on the flexible dielectric substrate may be electrically connected in series, in parallel, or individually depending on the desired application.

The LESDs may be bonded on a conductive material, enabling the LESDs to be electrically biased without the need for wire bonding.

Minimized yield loss in final packaging, overcoming wire bonding issues.

The dielectric layer may be achieved using wet chemistries, excimer laser ablation, and plasma etching.

The flexible dielectric substrate facilitates making a circuitry pattern on both sides of the substrate.

The flexible substrate provides great flexibility and bendability for the LESD articles.

A direct die attach method for bonding a wire bond free die to the conductive material provides enhanced thermal dissipation because of the relatively large contact area.

During a laser lift-off process, the flexible dielectric layer of the flexible LESD may act as a stress accommodating layer, which will keep the semiconductor layer of the die intact.

The flexible LES devices provide excellent heat dissipation, which is needed for high power LESDs.

The flexible LES devices can be wired as an array on a single flexible and insulating layer.

The resulting flexible LES devices can be bent in simple or compound curves.

The use of a flexible substrate with LESDs can eliminate the cost associated with conventional submounts.

The resulting flexible LES devices can provide a robust, cost-effective thermal management solution to the current and future high power LESD constructions.

Using the article of the present invention with a discrete LESD can reduce the overall thermal resistance of light emitting device.

Using the article of the present invention with discrete LESDs can allow for quick and cost-effective repair in that, e.g., individual defective LESDs may be easily detached and removed from the vias or cavities and replaced with new LESDs.

The vias and cavities of the present invention containing conductive material provide excellent Z-axis thermal conductivity.

The size of the vias and cavities and the surface area of the conductive layers can be tailored to provide optimized thermal resistance values.

The vias and cavities can be designed to accommodate various LESD electrical contacts.

The use of an article of the present invention with LESDs can eliminate the cost associated with conventional LED submounts.

The above summary of the present invention is not intended to describe each disclosed embodiment or every implementation of the present invention. The Figures and detailed description that follow below more particularly exemplify illustrative embodiments.

DETAILED DESCRIPTION

In the following description, reference is made to the accompanying set of drawings that form a part of the description hereof and in which are shown by way of illustration several specific embodiments. In general similar reference numbers are used for similar features in the various embodiments. Unless indicated otherwise, these similar features may comprise the same materials, have the same attributes, and serve the same or similar functions. Additional or optional features described for one embodiment may also be additional or optional features for other embodiments, even if not explicitly stated, where appropriate. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc. In addition, directional terminology, such as "top," "bottom," "front" "back," "above," "below," etc., is used with reference to the orientation of the Figure(s) being described. Because components of embodiments can be positioned in a number of different orientations, the directional terminology is used for purposes of illustration and is in no way limiting.

Figure 1:
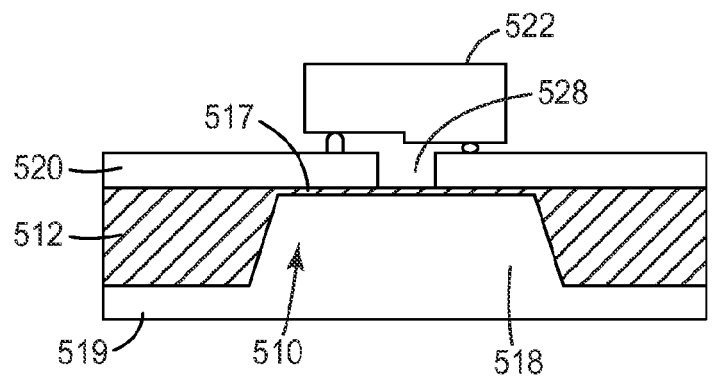
FIG. 1 is a schematic cross-sectional view of an exemplary embodiment of a flexible LESD according to an aspect of the present invention.

At least one embodiment of the present invention is illustrated in FIG. 1, which shows a flexible polymeric dielectric substrate 512 having at least one indentation or cavity 510. Cavity 510 is initially defined by walls and floor 517 (which in the configurations shown might be considered a ceiling), but may be further defined by layers and coatings applied to its walls and floor 517. (Although the plural term "cavity walls" is used herein, this term also refers to a single continuous curved wall such as those with a conical or frustoconical shape.) LESD 522 is a flip chip die, i.e., the die is "flipped" upside down when it is attached. A flip chip die may be referred to as a type of wire bond free die, which does not use wires to interconnect the chip pads to external circuitry. Flip chip is a method for interconnecting semiconductor devices, such as IC chips and microelectromechanical systems (MEMS), to external circuitry with solder bumps that have been deposited onto the chip pads. The solder bumps are deposited on the chip cathode and anode pads on the top side of the chip during the final processing step. In order to mount the chip to external circuitry (e.g., a circuit board or another chip or wafer), it is flipped over so that its side with electrical contacts faces down, and aligned so that its pads align with matching pads on the external circuit, and then the solder is flowed to complete the interconnect. This is in contrast to wire bonding, in which the chip is mounted upright and wires are used to interconnect the chip pads to external circuitry. In some embodiments, a flip chip die includes an anode and a cathode that are not on the same plane. Further, bond sites located on conductive layer 520 for the two LESD contacts need to be electrically isolated from each other. This may be done, for example as is shown in FIG. 1, by creating a gap 528 in conductive layer 520. Gap 528 may be created, e.g., by removing a portion of conductive layer 520, such as by etching or other suitable removal processes. The thin dielectric layer forming floor 517 of cavity 510 may be continuous, as shown in FIG. 1, or may also have a gap. In FIG. 1, floor 517 is formed by a portion of dielectric substrate 512. The walls and floor of cavity 510 support conductive material 518, which completely fills cavity 510. In some embodiments, conductive material 518 may support additional layers such as a reflective coating. The reflective coating may be gold, silver, aluminum with enhanced reflectivity, an inherently reflective dielectric material, or a pigmented material. Conductive layer 519 is located on the bottom surface of dielectric substrate 512 and conductive layer 520 is located on the top surface of dielectric substrate 512. In some embodiments, conductive layer 519 comprises an electrically conductive circuit. Conductive layer 519 is preferably thermally conductive. Conductive layer 520 supports LESD 522. Conductive layer 520 is preferably electrically conductive and optionally thermally conductive. In some embodiments, conductive layer 520 comprises an electrically conductive circuit. Conductive material 518 may comprise a portion of conductive layer 519 that is located in cavity 510, may comprise conductive material other than a portion of conductive layer 519 that is deposited in cavity 510, or may comprise a combination of both. Conductive layer 519 and conductive material other than conductive layer 519 may comprise the same or different matter. For example, both may be copper, or they may be different e.g., conductive layer 519 might be copper while the conductive material 518 may be solder. If conductive layer 519 and the conductive material 518 comprise the same matter, the interface between the two may be obscured. In at least one aspect, conductive layer 520 functions as an electrically conductive layer, while conductive layer 519 functions as a heat sink, facilitating effective heat dissipation from LESD 522. In at least one aspect, the thickness of conductive layer 520 may be adjusted to accommodate flip chip die bonding, e.g., when the anode and cathode of the flip chip die are not on the same plane. The flip chip die may be bonded by any suitable known method. This height adjustment may be accomplished by removing material from, or adding material to, one bond site. Material may be removed by known methods such as chemical etching, plasma etching, focused ion-beam etching, and laser ablation. Where necessary, the bond pad remaining the same height can be covered with a photomask during the etching process. Material can be added to one of the bond sites by methods such as electroplating. Again, where necessary, the bond pad (and other conductive surfaces) remaining the same height can be covered with a photomask during the plating process. In at least one aspect, filling cavity 510 completely with conductive material 518 provides a heat sink directly beneath LESD 522, facilitating effective heat dissipation from LESD 522.

Figure 8:
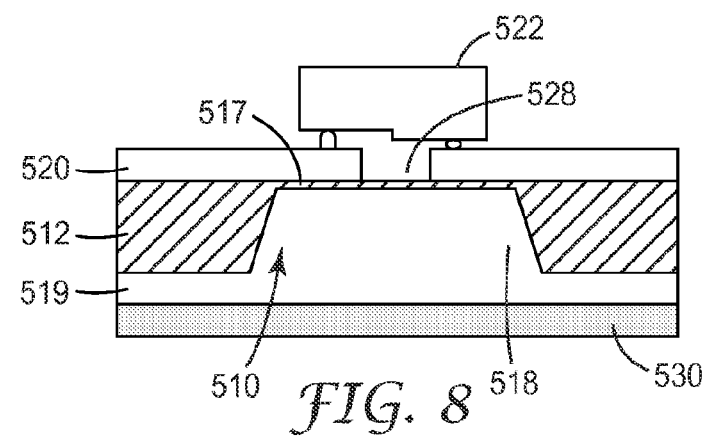
FIG. 8 is a schematic cross-sectional view of another exemplary embodiment of a flexible LESD according to an aspect of the present invention.

At least one embodiment of the present invention is illustrated in FIG. 8, which shows a flexible LESD similar to the flexible LESD shown in FIG. 1, having a TIM 530 is disposed on conductive layer 519.

Figure 2:
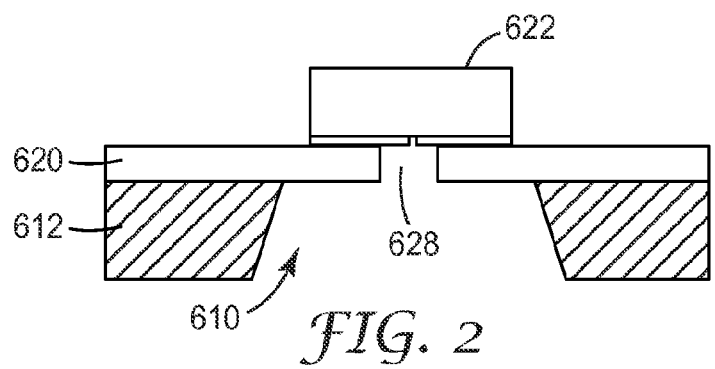
FIG. 2 is a schematic cross-sectional view of another exemplary embodiment of a flexible LESD according to an aspect of the present invention.
Figure 6:
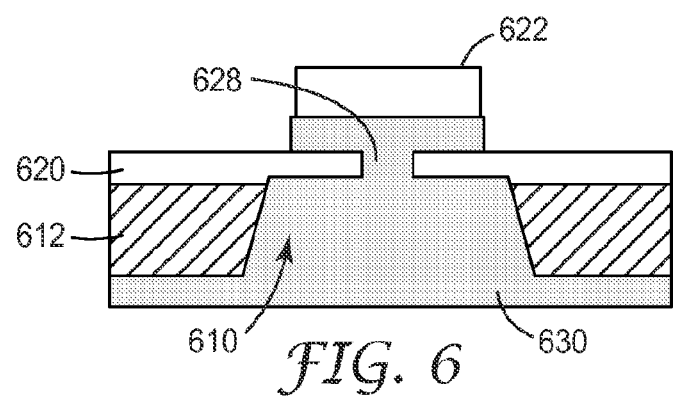
FIG. 6 is a schematic cross-sectional view of another exemplary embodiment of a flexible LESD according to an aspect of the present invention.

At least one embodiment of the present invention is illustrated in FIG. 2, which shows a flexible dielectric substrate 612 having at least one via 610. Via 610 is initially defined by walls and conductive layer 620 located on the top surface of dielectric substrate 612, but may be further defined by layers and coatings applied to its walls and the portion of conductive layer 620 above the top opening of via 610. An LESD 622 is located on conductive layer 620. Bond sites located on conductive layer 620 are electrically isolated from each other by gap 628 in conductive layer 620. LESD 622 is a lateral die, i.e., the electrical contacts are on the bottom of the die, and are substantially on the same plane. Similar to a flip chip die, a lateral die may be referred to as a type of wire bond free die, which does not use wires to interconnect the chip pads to external circuitry. In one aspect, whereas in a flip chip die the major emitting surface faces downward, in a lateral die the major emitting surface faces upward. As a result, the use of a reflective coating may be less essential. With respect to bonding, advantages of a lateral die compared with a flip chip die may include that various bonding methods may be used, that the bonding pads are substantially on the same plane, that the bonding pads are on the back side of the LED substrate resulting in no obstruction to emitted light, and the presence of relatively large bond pads for effective heat dissipation. Examples of lateral die configurations that can be used in aspects of the present invention are shown and described in U.S. Patent Publication Nos. 2010/0252840 A1, 2010/0155746 A1, and 2011/0084294 A1. Various methods may be used to bond a lateral die, such as, e.g., flip chip bonding or a direct die attach method. Direct die attach is a method for interconnecting semiconductor devices, such as IC chips and microelectromechanical systems (MEMS), to external circuitry using, e.g., eutectic, conductive paste, or solder to directly bond and electrically connect the die to the substrate. This is in contrast to wire bonding, in which wires are used to interconnect the chip pads to external circuitry. An example of direct die attach includes gold-tin eutectic die attachment. In some embodiments, a lateral die includes an anode and a cathode that have a different size. Bond sites located on conductive layer 620 for the two LESD contacts may be configured to accommodate this, e.g., by positioning gap 628 such that the anode bond site corresponds to the size of the anode and the cathode bond site corresponds to the size of the cathode. The lateral die may be bonded by any suitable known method. An example of such a construction is shown in FIG. 6.

Figure 3:
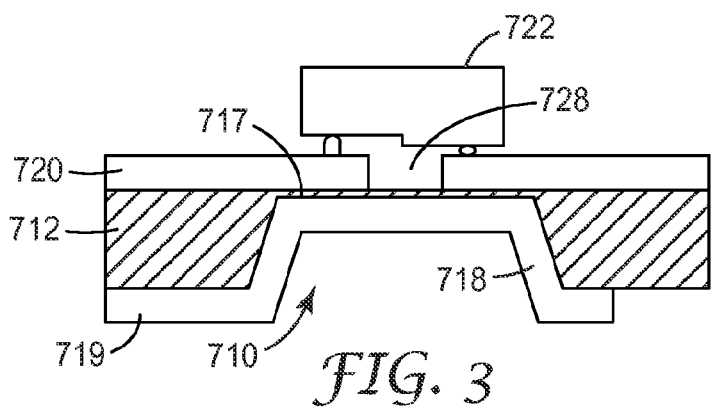
FIG. 3 is a schematic cross-sectional view of another exemplary embodiment of a flexible LESD according to an aspect of the present invention.
Figure 5:
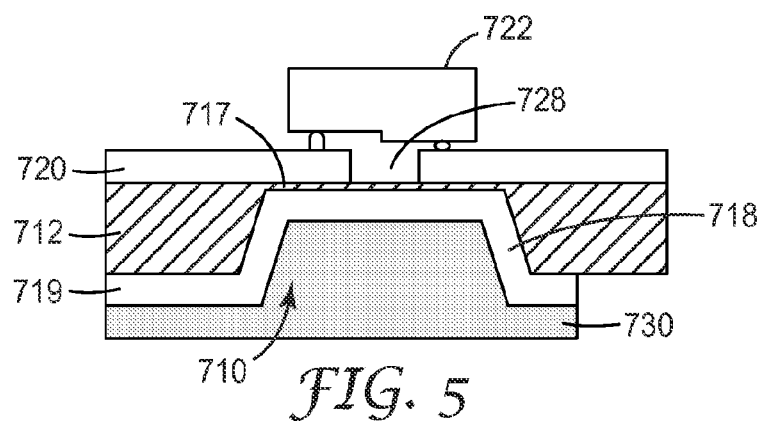
FIG. 5 is a schematic cross-sectional view of another exemplary embodiment of a flexible LESD according to an aspect of the present invention.

At least one embodiment of the present invention is illustrated in FIG. 3, which is substantially similar to the embodiment of FIG. 1 in that it includes a flexible polymeric dielectric substrate 712 having a conductive layer 720 on the top surface thereof on which is located an LESD 722, a conductive layer 719 on the bottom surface thereof, and at least one indentation or cavity 710 therein extending from the bottom surface toward the top surface. Floor 717 of cavity 710 is formed by a portion of dielectric substrate 712. Bond sites located on conductive layer 720 are electrically isolated from each other by gap 728. In this embodiment, conductive material 718 does not completely fill cavity 710. In at least one aspect, a reduced amount of conductive material 718 may be used in combination with a TIM 730 to provide a heat sink directly beneath LESD 722, facilitating effective heat dissipation from LESD 722. An example of such a construction is shown in FIG. 5.

Figure 4:
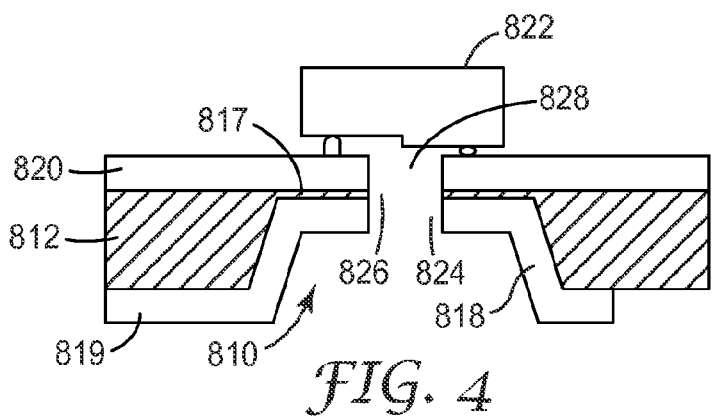
FIG. 4 is a schematic cross-sectional view of another exemplary embodiment of a flexible LESD according to an aspect of the present invention.

At least one embodiment of the present invention is illustrated in FIG. 4, which is substantially similar to the embodiment of FIG. 3 in that it includes a flexible polymeric dielectric substrate 812 having a conductive layer 820 on the top surface thereof on which is located an LESD 822, a conductive layer 819 on the bottom surface thereof, and at least one indentation or cavity 810 therein extending from the bottom surface toward the top surface. Bond sites located on conductive layer 820 are electrically isolated from each other by gap 828, and conductive material 818 does not completely fill cavity 810. In this embodiment, the portion of dielectric substrate 812 forming cavity floor 817 of cavity 810 also has a gap 826, and the conductive material deposited in the cavity also has a gap 824.

In at least one aspect, the presence of gap 828 in conductive layer 820 and gap 826 in dielectric substrate 812 enable gap 824 to be formed by removing a portion of conductive material 818 from the top side of the structure.

Figure 7:
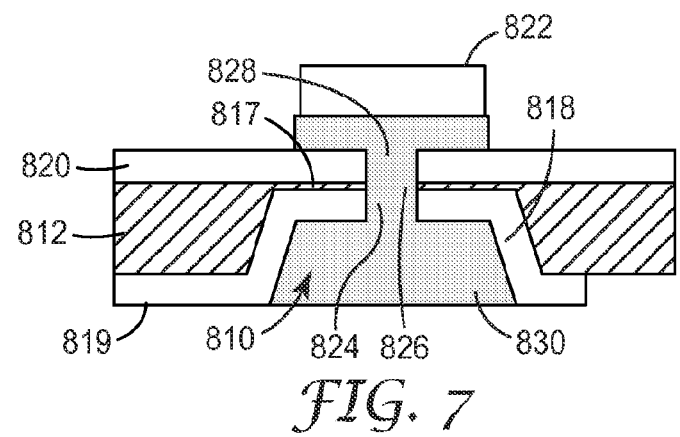
FIG. 7 is a schematic cross-sectional view of another exemplary embodiment of a flexible LESD according to an aspect of the present invention.

Having an aligned opening through layers 820, 812, and 818, as created by the existence of gaps 824, 826, and 828 allows a TIM 830 or any suitable heat dissipation material to be applied into gaps 824, 826, and 828, and into cavity 810, as well as on to conductive layer 820 so that it is adjacent to, or around the base of, LESD 822, so that it can facilitate effective heat dissipation from LESD 822. An example of such a construction is shown in FIG. 7.

Figure 9:
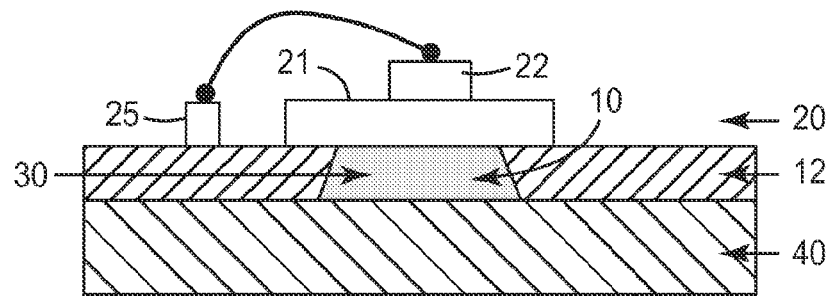
FIG. 9 is a schematic cross-sectional view of another exemplary embodiment of a flexible LESD according to an aspect of the present invention.

At least one embodiment of the present invention is illustrated in FIG. 9, which shows a flexible dielectric layer 12 having at least one via 10 filled with thermal interface material (TIM) 30. Via 10 extends all the way through dielectric layer 12 and may be any suitable shape, e.g., circular, oval, rectangular, serpentine, a channel, a grid (e.g., forming islands of dielectric layer separated by a continuous pattern of overlapping channels), etc. For example, if the via is channel-shaped or grid-shaped, a continuous path of TIM 30 can be located within the outer confines of dielectric layer 12. The flexible dielectric layer 12 has first and second major surface. Conductive layer 20 is disposed on the first major surface of dielectric layer 12 and may be patterned to include a conductive feature 21, which may be an electrically isolated conductive feature, on which feature LESD 22 is disposed. LESD 22 can be attached, directly, or indirectly, to conductive feature 21 using a known die bonding method such as eutectic, solder (including solder bumps for flip chip mounting), adhesive, and fusion bonding. LESD 22 may be wire bonded through conductive bump 25 to an electrically conductive circuit also patterned in conductive layer 20. Conductive bump 25 may comprise Au, AuSn, AuGe, or other suitable materials. In some embodiments, a passivation or bonding layer is located beneath LESD 22 to facilitate bonding LESD 22 to an underlying layer. In at least one embodiment, conductive substrate 40 is attached to the flexible LES device adjacent the second major surface of dielectric layer 12, which brings it into contact with the TIM 30 in via 10. Conductive substrate 40 may be any material that is thermally conductive. For example, conductive substrate may be a metal strip, e.g., of copper or aluminum, a heat sink, or other heat transferring or heat absorbing material. Conductive substrate 40 may be attached to the flexible LES device using a thermally conductive adhesive. The juxtaposition of conductive feature 21, TIM 30 in via 10, and conductive substrate 40 allows for efficient dissipation of heat generated by the LESD to conductive substrate 40. In addition, the TIM in via 10 can provide mechanical support for conductive feature 21, which is essentially suspended over the opening of via 10.

While a single via is described in this embodiment, the flexible LES device may comprise an array of LESDs, at least one of which is disposed above a TIM-filled via.

Figure 10A:
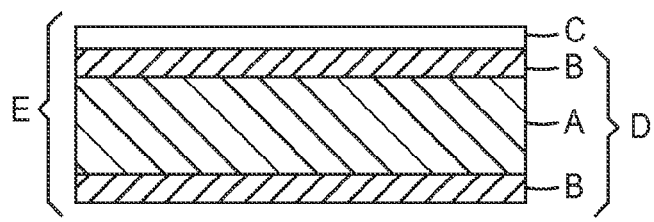
FIGS. 10A-10C are schematic cross-sectional views of an exemplary process for preparing a substrate for a flexible LESD of the present invention.
Figure 10B:
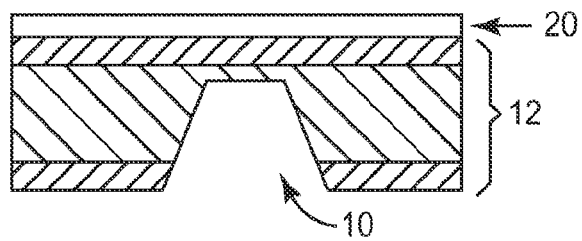
Figure 10C:
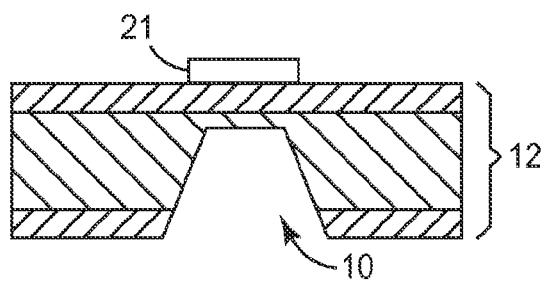

In at least one embodiment of the present invention, a UPISEL VT dielectric layer is a suitable starting material for forming a dielectric layer with cavities, particularly if cavities are formed by chemical etching. FIGS. 10A-10C illustrate a UPISEL VT dielectric substrate (labeled D in FIG. 10A) clad on one side with a copper layer (labeled C in FIG. 10A) which comprises conductive layer 20 (the structure being commercially available under the trade designation UPILEX N from Ube Industries, Japan (labeled E in FIG. 10A)) having a cavity etched according to an embodiment the present invention. As shown in FIG. 10A, UPISEL VT (labeled D in FIG. 10A) which comprises flexible dielectric layer 12 is constructed of a core layer comprising UPILEX S (labeled A in FIG. 10A) and thin outer layers comprising a thermoplastic polyimide (TPPI) (labeled B in FIG. 10A).

The UPISEL VT may be etched using any suitable chemistry, such as KOH/ethanol amine/ ethylene glycol described in more detail on U.S. Patent Publication. No. 2007-0120089-A1. With this etchant, the hydrophobic nature and higher modulus of the UPILEX S results in etching by a dissolution mechanism that makes the side walls of the cavity very smooth. Because this etchant formulation etches quickly, the etching may be stopped before the cavity 10 reached the second TPPI layer, as illustrated in FIG. 10B, then, a subsequent etching can be performed with a KOH/ potassium permanganate (PPM) solution, comprising about 0.7 to about 1.0 wt % KOH and about 3 wt % $KMnO_4$, which is not an effective etchant of the TPPI layer, to remove the remaining thin layer of UPILEX S core, thereby leaving the thin TPPI layer on the closed end of the cavity, as illustrated in FIG. 10C. FIG. 10C also shows that the clad copper conductive layer 20 has been patterned to form a conductive feature 21.

Other suitable etchant chemistries are the KOH/glycine, and KOH/glycine/ethylene diamine chemistries described in more detail in co-pending U.S. Provisional Patent Application No. 61/409791. The KOH/glycine etchant provided a slow, controlled etching. The etching rate can be increased by adding ethylene diamine to the etchant formulation.

Embodiments of the present invention having vias or cavities with sloped side walls may be preferred because, e.g., for a given thickness of dielectric layer and a given via or cavity diameter nearest a conductive feature, a via having sloped side walls can contain more material than a via having 90° side walls. For example, the opening of a via adjacent a conductive feature typically will be limited by the size of that conductive feature; however, by employing sloped via side walls, the opening at the opposing end of the via may be enlarged to an optimum size such that the via can contain a larger amount of TIM (to transfer more heat away from the LESD) and the TIM at this opening has a large surface area that can interface more effectively with a heat transferring or absorbing material which may be attached to the dielectric layer and TIM-filled vias.

Figure 11A:
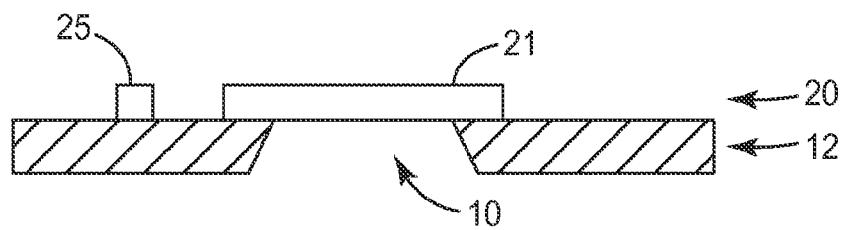
FIGS. 11A-11D are schematic cross-sectional views of an exemplary process for preparing a flexible LESD of the present invention.
Figure 11B:
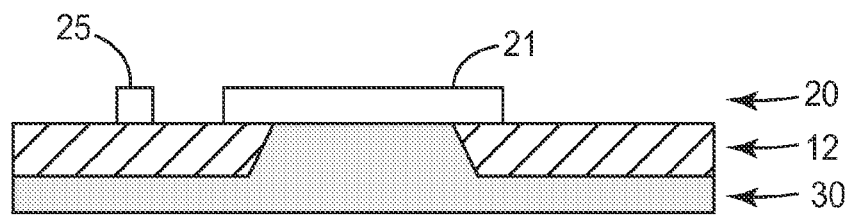
Figure 11C:
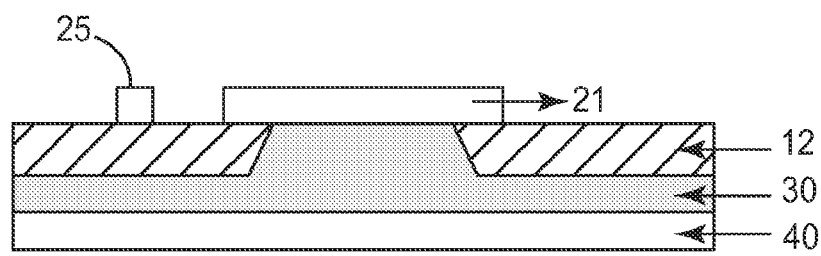
Figure 11D:
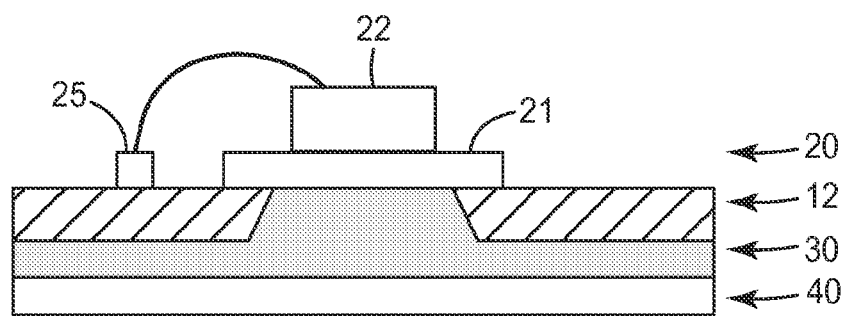

FIGS. 11A-11D illustrate a process for making an embodiment of the present invention in which the TIM material is in the vias, but also forms a layer on the second major surface of the dielectric layer. FIG. 11A shows dielectric layer 12 in which via 10 has been formed. It further shows conductive layer 20 which has been patterned to include conductive feature 21 and conductive bump 25. In FIG. 11B, TIM 30 has been added in via 10 and as a layer on the second major surface of dielectric layer 12. In FIG. 11C, conductive substrate 40 has been attached to the layer of TIM. In another embodiment of the present invention, TIM 30 may be first applied to conductive substrate 40, then attached to the second major surface of dielectric layer and conformed to fill vias 10. In FIG. 11D, LESD 22 has been placed on conductive feature 21 and wire bonded to conductive bump 25. In embodiments of the invention having the layer of TIM on the second surface of the dielectric layer, the surface area of the TIM in contact with an adjacent thermally conductive substrate can be maximized, which can allow for more and faster heat transfer away from LESD 22. Additionally, the full layer of TIM may provide structural support for the flexible LES device and may provide other benefits such as acting as a compliant layer to accommodate thermal and bonding stresses. In an alternate embodiment of the present invention, instead of applying conductive substrate to TIM 30, an adhesive liner can be applied to the TIM, in particular, a TIM with adhesive properties, so that the flexible LES device can be directly applied, at a later time, to a conductive material or a heat sink. This embodiment can be particularly useful if the conductive material is large and or stationery. For example, a sheet of TIM-coated flexible LES devices could be adhered directly to a metal post to create a lighting feature. Further, the metal post could be hollow with air moving through it to conduct heat away from the LESDs.

Figure 12:
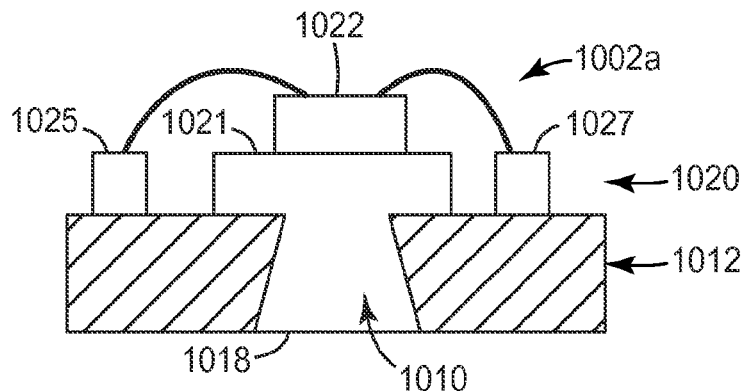
FIG. 12 is a schematic cross-sectional view of another exemplary embodiment of a flexible LESD according to an aspect of the present invention.

At least one embodiment of an article 1002a of the present invention is illustrated in FIG. 12, which shows a flexible dielectric layer 1012 having at least one via 1010 filled with conductive material 1018, which may be copper or other conductive materials. Via 1010 extends through dielectric layer 1012 and may be any suitable shape, e.g., circular, oval, rectangular, serpentine, a channel, a grid (e.g., forming islands of dielectric layer separated by a continuous pattern of overlapping channels), etc. For example, if the via is channel-shaped or grid-shaped, a continuous path of conductive material 1018 can be located within the outer confines of dielectric layer 1012. The flexible dielectric layer 1012 has first and second major surface. Conductive layer 1020 is disposed on the first major surface of dielectric layer 1012 and may be patterned to include a conductive feature 1021, which may be an electrically isolated conductive feature, on which feature LESD 1022 is disposed. LESD 1022 can be attached, directly, or indirectly, to conductive feature 1021 using a known die bonding method such as eutectic, solder, adhesive, and fusion bonding. LESD 1022 may be wire bonded through conductive pads 1025 and 1027 to electrically conductive circuits also patterned in conductive layer 1020. Conductive pads 1025, 1027 may comprise Au, AuSn, AuGe, or other suitable materials. In some embodiments, a passivation or bonding layer is located beneath LESD 1022 to facilitate bonding LESD 1022 to an underlying layer. In at least one embodiment, a conductive substrate 1030 (FIG. 15) is attached to the article adjacent the second major surface of dielectric layer 1012, which brings it into contact with conductive material 1018 in via 1010. Conductive substrate 1030 may be any material that is thermally conductive. For example, conductive substrate 1030 may be a thermal interface material (TIM), a metal strip, e.g., of copper or aluminum, a heat sink, or other heat transferring or heat absorbing material. Conductive substrate 1030 may be attached to the article using a thermally conductive adhesive. The juxtaposition of conductive feature 1021, conductive material 1018 in via 1010, and conductive substrate 1030 allows for efficient dissipation of heat generated by the LESD to conductive substrate 1030. In addition, the conductive material in via 1010 can provide mechanical support for conductive feature 1021, which is essentially suspended over the opening of via 1010. In an alternate embodiment of the present invention, instead of applying conductive substrate to conductive material 1018, an adhesive liner can be applied to the conductive material, in particular, a TIM with adhesive properties, so that the article can be directly applied, at a later time, to a conductive substrate or a heat sink.

Figure 13A:
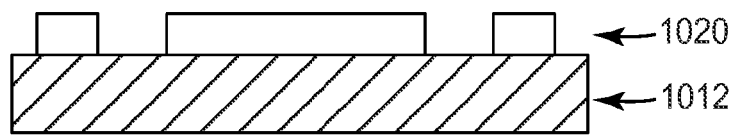
FIGS. 13A-13E are schematic cross-sectional views of an exemplary process for preparing a flexible LESD of the present invention.
Figure 13B:
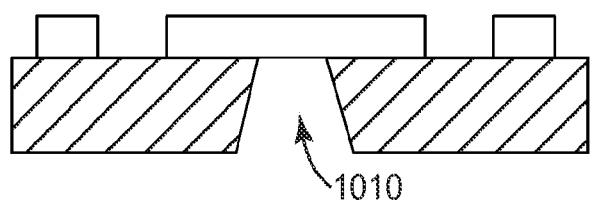
Figure 13C:
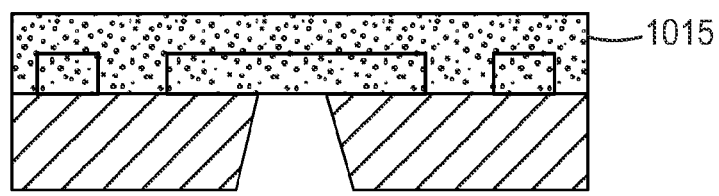
Figure 13D:
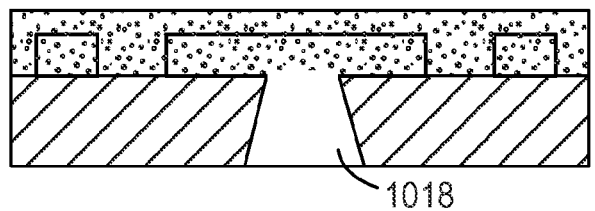
Figure 13E:
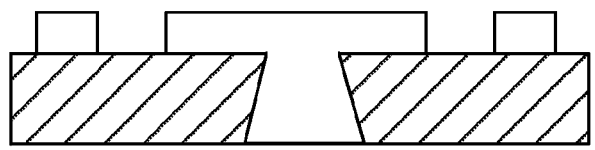

FIGS. 13A through 13E show a method of making the article 1002a illustrated in FIG. 12. Conductive layer 1020 is applied and patterned on a first side of flexible dielectric layer 1012 (FIG. 13A), then via 1010 is formed in flexible dielectric layer 1012, extending from a second side to the first side of flexible dielectric layer 1012 (FIG. 13B), a photoresist mask 1015 is applied over conductive layer 1020, except for the portion exposed by via 1010 (FIG. 13C), via 1010 is filled with conductive material 1030, e.g., by electrodeposition such as electroplating by building up conductive material 1018 on the surface of the conductive layer 1020 facing the via (FIG. 13D), and the photoresist layer is removed (FIG. 13E).

Figure 14:
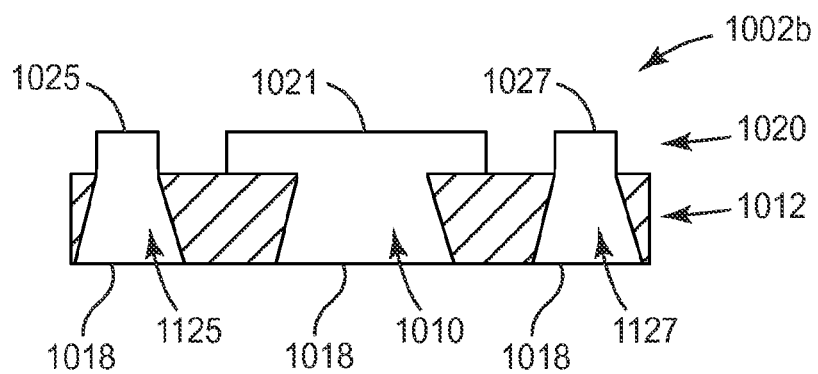
FIG. 14 is a schematic cross-sectional view of another exemplary embodiment of a flexible LESD according to an aspect of the present invention.

FIG. 14 is an alternate embodiment of the article of FIG. 12. The article 1002b of FIG. 14 has two additional vias 1125 and 1127 extending through dielectric layer 1012 beneath conductive pads 1025 and 1027 and are filled with conductive material 1018, which may be copper or other conductive materials. These vias can acts as both electrodes and heat transfer channels. If the article has cavities in place of vias 1125 and 1127, the cavities can act as heat transfer channels, but would not act as electrodes because they would be insulated from conductive pads 1025 and 1027 by a thin layer of dielectric material.

Figure 15:
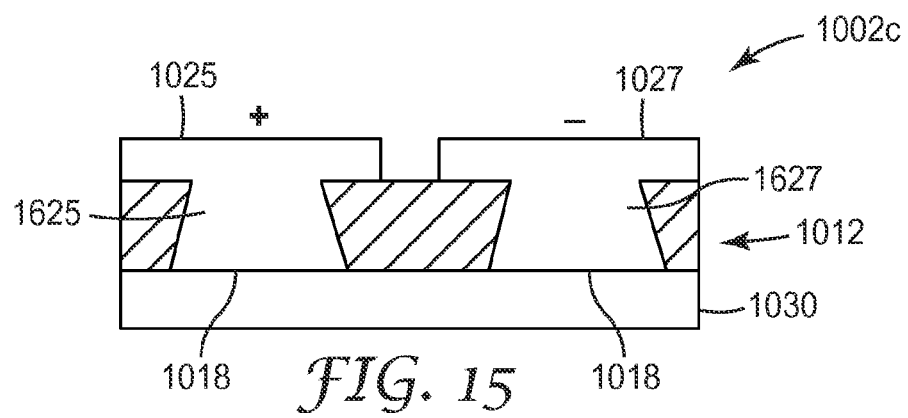
FIG. 15 is a schematic cross-sectional view of another exemplary embodiment of a flexible LESD according to an aspect of the present invention.

FIG. 15 illustrates an embodiment of an article 1002c having a flexible dielectric layer 1012 having two vias 1625 and 1627 extending therethrough beneath conductive pads 1025 and 1027, respectively. Vias 1625 and 1627 are filled with conductive material 1018, which may be copper or other conductive materials. These vias can act as both electrodes and heat transfer channels. If the article has cavities in place of vias 1125 and 1127, the cavities can act as heat transfer channels, but would not act as electrodes because they would be insulated from conductive pads 1025 and 1027 by a thin layer of dielectric material. An optional thermally conductive substrate 1030 is shown in FIG. 15.

Figure 16:
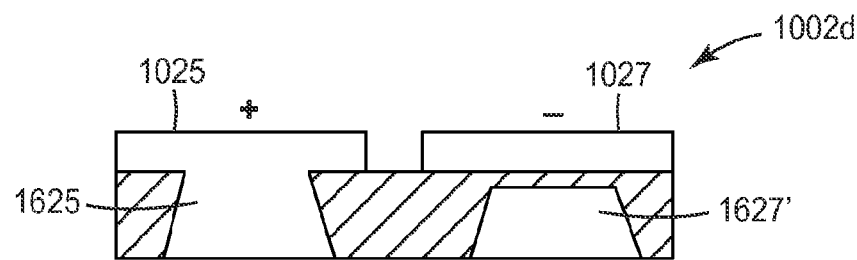
FIG. 16 is a schematic cross-sectional view of another exemplary embodiment of a flexible LESD according to an aspect of the present invention.

FIG. 16 illustrates an embodiment of an article 1002d similar to that of FIG. 15 except that there is a via 1625 extending through dielectric layer 1012 under conductive pad 1025 and a cavity 1627' under conductive pad 1027. In this configuration, via 1625 would be electrically connected to conductive pad 1025, cavity 1627' would not be electrically connected to pad 1027, but both via 1625 and cavity 1627' would act as heat transfer channels.

Figure 17:
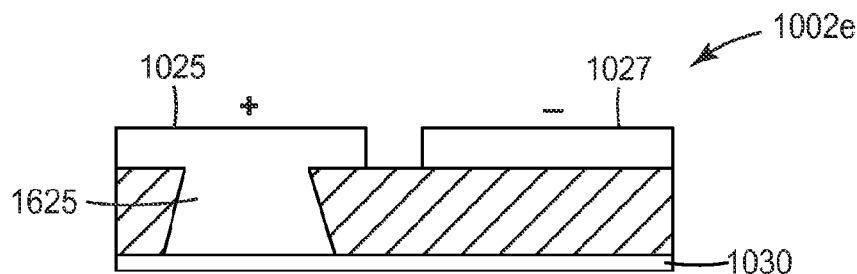
FIG. 17 is a schematic cross-sectional view of another exemplary embodiment of a flexible LESD according to an aspect of the present invention.

FIG. 17 illustrates an embodiment of article 1002e similar to that of FIGS. 15 and 16 except that there is only a via 1625 extending through dielectric layer 1012 under conductive pad 1025. There is no via or cavity under conductive pad 1027. An optional thermally conductive substrate 1030 may be attached to the second surface of dielectric layer 1012.

Figure 18A:
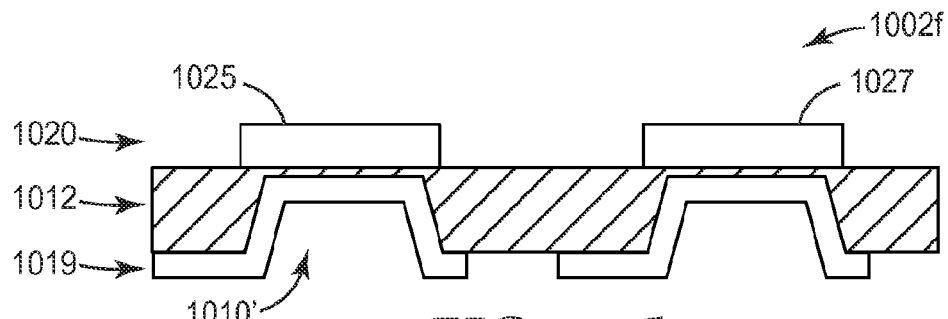
FIGS. 18A-18B are schematic cross-sectional view of exemplary embodiments of a flexible LESD according to aspects of the present invention.
Figure 18B:
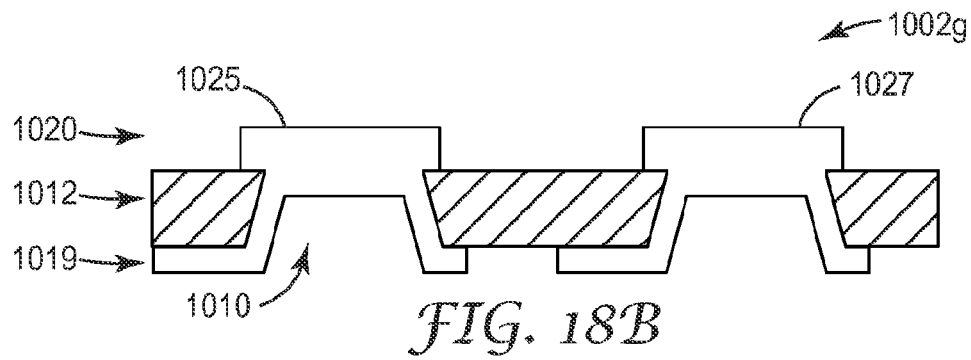

FIGS. 18A and 18B illustrate embodiments of articles 1002e and 1002f in which the cavities 1010' (FIG. 18A) or vias 1010 (FIG. 18B) extend from the second side to the first side of dielectric layer 1012. FIG. 18A includes conductive layer 1019 on the second surface of dielectric layer 1012 and conductive layer 1020 on the first surface of dielectric layer 1012. Conductive layer 1019 is patterned on the second surface of dielectric layer 1012 and extends into cavities 1010'. Cavities 1010' may contain additional conductive material (not shown). Conductive layer 1020 is patterned to form conductive pads 1025 and 1027 to which LESDs may be attached. These conductive pads are electrically insulated from cavities 1010'. FIG. 18B includes conductive layer 1019 on the second surface of dielectric layer 1012 and conductive layer 1020 on the first surface of dielectric layer 1012. Conductive layer 1019 is patterned on the second surface of dielectric layer 1012 and extends into vias 1010. Vias 1010 extend entirely through dielectric layer 1012 and may contain additional conductive material (not shown). Conductive layer 1020 is patterned to form conductive pads 1025 and 1027 to which LESDs may be attached.

Although most exemplary embodiments of flexible LESDs described herein pertain to the use of wire bond free LESDs, with slight modifications that could be ascertained by one of ordinary skill in the art, the structures described herein could also be used with LESDs having one or both electrodes that requires wire bonding.

Any suitable TIM may be used in embodiments of the present invention. Depending on the embodiment, the TIM may be applied to the flexible LES device as a liquid, paste, gel, solid, etc. Suitable methods for applying TIM depend on the properties of the specific TIM, but include precision coating, dispensing, screen printing, lamination, etc.

Suitable methods for curing a curable TIM include UV curing, thermal curing, etc.

The TIM may be coated on, e.g., as a liquid or a semi-solid such as a gel or paste, or may be laminated on in sheet form. A combination of TIMs could be used. For example, a first type of TIM may be applied in the vias or cavities and a second type of TIM may be applied to the second major surface of the dielectric layer, which would bring it into contact with the first type of TIM. If a sheet of TIM is applied to the second major surface of the dielectric layer without previously filling the vias or cavities with TIM, the sheet is preferably sufficiently conformable or reconfigurable to fill the vias or cavities. For example, a suitable type of sheet material would be an uncured thermoset material that, upon application of heat, would soften sufficiently to fill the vias or cavities before curing. In some embodiments, the TIM may also be adhesive-based. In such an embodiment, the TIM could adhere directly to the second major surface of the dielectric layer on one side and a conductive substrate on the other. A TIM that does not have adhesive properties could be applied to one or both of the second major surface of the dielectric layer and the conductive substrate with a thermally conductive adhesive. As previously mentioned, the TIM may be first applied to the second major surface of the dielectric layer and a conductive substrate applied to the TIM thereafter, or the TIM may be first applied to a conductive substrate and the TIM-coated conductive substrate applied to the second major surface of the dielectric layer thereafter.

In some embodiments a suitable TIM may be a paste-like thermally conductive material, such as silicone grease, and in other embodiments a sheet-like thermally conductive material, such as silicone rubber. In still other embodiments, a combination of the two may be used.

Types of materials suitable for use in TIMs include, but are not limited to curable thermosets, thermoplastics, including thermoplastics with conductive fillers, pressure sensitive adhesives, and elastomers. Specific materials suitable for use in TIMs include silicone, polyimide, epoxy, B-stage UV curable adhesives, and high temperature silicon based adhesives.

Suitable TIMs may be filled with thermally conductive material that may or may not also be electrically conductive. Suitable materials include silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon particles, carbon black, carbon allotropes such as graphite, graphene, carbon nanotubes, boron-nitride coated particles, and mixtures thereof. The thermally conductive materials may be in the form of particles, spheres, flakes, or any other suitable form. In at least some embodiments, the thermally conductive material may comprise about 5 wt % to about 60 wt % of the TIM, preferably about 10 wt % to about 50 wt %.

TIMs suitable for use in the present invention may include, for example, adhesives filled with one or more of alumina, aluminum nitride, boron nitride, carbon nanotubes, carbon particles, and graphene.

Preferably the TIMs have low thermal resistance; are capable of wetting substrates with high surface energy, such as metals, and low surface energy, such as plastics; will remain adhered to the surfaces to which it is attached and will not flow to any unwanted areas of the devices to which it is being applied.

In exemplary embodiments described herein, the vias and cavities may be any suitable shape, e.g., circular, oval, rectangular, serpentine, a channel, a grid (e.g., forming islands of dielectric substrate separated by a continuous pattern of overlapping channels), etc., and may contain a single LESD or may contain multiple LESDs. For example, if the via or cavity is channel-shaped or grid-shaped, or large, multiple LESDs may be located in a single via or cavity.

In each of the exemplary embodiments described herein, the flip chip die may be bonded to the isolated conductors of the flexible substrate by a flip chip bonding process. To facilitate this, the isolated conductors may be provided with respective conductive bumps. The lateral die may be bonded to the isolated conductors of the flexible substrate using a direct die attach method. An exemplary bonding method that can be used in aspects of the present invention for bonding a wire bond free die (including, e.g., a flip chip die and a lateral die) includes using an anisotropic conductive film (ACF). First, the ACF is applied onto the isolated conductors using a pick and place method. Then, the die is attached in a flip chip configuration (in case of a flip chip die) or a lateral configuration (in case of a lateral die) using temperature and force. The ACF is activated and adjusts to the desired thickness to make the electrical connections between the wire bond free die and the isolated conductors by alignment of the particles anisotropically providing the electrical contacts with the respective contact pads of the wire bond free die. Another exemplary bonding method that can be used in aspects of the present invention includes using a conductive adhesive where the conductive adhesive is placed on the isolated conductors. When placing the die in a flip chip configuration (in case of a flip chip die) or a lateral configuration (in case of a lateral die) under pressure, the conductive adhesive conforms and adjusts to the desired thickness to make the electrical connections between the wire bond free die and the isolated conductors. Another exemplary bonding method that can be used in aspects of the present invention includes creating metal solder bumps on the isolated conductors. Solder flux is applied onto the solder bumps and the wire bond free die is placed on the solder bumps. Using a solder reflow process, the solder bumps initiate the bonding and adjust to the desired thickness to make the electrical connections between the wire bond free die and the isolated conductors.

An advantage of flexible LESDs according to aspects of the present invention relates to a laser lift-off process. For certain wire bond free LESDs, such as, e.g., high power blue LEDs, a gallium nitride (GaN) or indium gallium nitride (InGaN) semiconductor layer, in some cases having a thickness of a few microns, is grown on a sapphire (Al2O3) substrate, in some cases having a thickness of 120-150 microns. Mainly to achieve high power operations, the sapphire may be removed from the semiconductor layer using a laser lift-off process. In a typical laser lift-off process, a high intensity laser beam is directed through the sapphire and aimed at the semiconductor layer. This creates a shockwave at the interface disassociating the sapphire from the semiconductor layer. During this process, stress is transmitted to the relatively thin semiconductor layer. For wire bond free dies on rigid substrates, such as, e.g., silicon (Si) or ceramics, this stress may cause the semiconductor layer to later crack. However, for wire bond free dies on flexible LESDs according to aspects of the present invention, the flexible dielectric layer may act as a stress accommodating layer, which will help keep the semiconductor layer intact.

In at least one embodiment of the present invention, a thermally conducting layer is located on the bottom surface of the dielectric substrate and may be a portion of an electrical circuit formed using conventional flexible circuit manufacturing processes. The portion of the dielectric layer that form the floor of the cavity is preferably thin, e.g., up to about 20% of the thickness of the dielectric layer. For a dielectric layer having a thickness of about 50 micrometers, a suitable thickness for the remaining dielectric layer is up to about 10 micrometers (about 20% of the total dielectric thickness), preferably about 1 to about 5 microns, so that it will not significantly inhibit heat transfer. It may be desirable to retain this thin layer of dielectric material, for example, to provide structural integrity, to manage CTE mismatches of adjacent material, or to provide an electrical barrier.

The conductive material in the cavities or vias may be as thin on the cavity floor or conductive layer covering the via opening as it is on the cavity or via walls, or it may be thinner or thicker. If it is thicker, it may partially or fully fill the cavity or via. For embodiments in which additional conductive material is added in the center of the cavity or via after a layer of conductive material has been applied to at least the walls of the cavity or via, the added conductive material results in a thicker amount of conductive matter in the bottom of the cavity or via than on the (upper) cavity or via walls and, therefore, added conductive material may partially or fully fill the cavity or via. The added conductive material may fill the cavity or via to any suitable level, e.g., 10%, 15%, 25% or greater. In some embodiments, the conductive material fills a larger percentage of the cavity or via, e.g., about 50%, about 75%, or about 100.

Optionally, additional conductive matter can be deposited in the cavity or via to increase the thickness of the conductive material. In some embodiments, the entire top conductive layer, including the portion that comprises the conductive material in the cavity or via, is made relatively thick and no additional conductive material is added in the cavity or via. In at least some embodiments of the present invention, a top conductive, e.g., copper, layer with a thickness of about 50 um to about 100 um, preferably about 75 um to about 100 um, on the dielectric layer surface, and in the cavity or via, may significantly enhanced heat dissipation away from the LESD The conductive layer on the bottom surface of the dielectric substrate may be any suitable thickness. Making this conductive layer thick, e.g., about 35 micrometers (um), preferably about 50 um, about 75 um, about 100 um or more may enhance heat removal from the LESDs.

Suitable conductive matter for use in the electrically and/or thermally conductive layers of the present invention will depend on the application, but may include, for example, conductive metals such as copper, silver, gold, nickel, aluminum, tin, and alloys thereof; thermally and electrically conductive adhesives, including non-conducting adhesives filled with conductive material, e.g., conductive particles, such that the resulting adhesive is conductive.

Suitable conductive matter for use in the conductive materials of the present invention will also depend on the application, but may include metals such as copper, gold, silver, nickel aluminum, tin, and alloys thereof as well as solders, conductive polymers, and conductive adhesives, including non-conductive polymers and adhesives filled with conductive material, e.g., conductive particles, such that the resulting matter is conductive.

Suitable electrically and/or thermally conductive particles include aluminum, gold, silver, chromium, copper, palladium, nickel and alloys thereof, aluminum nitride (AlN), aluminum oxide (Al2O3), barium nitride (BN), nanometer-sized silver particles, carbon blacks, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

Suitable polymeric materials for use in the flexible polymeric dielectric layer of the present invention include polyesters, polycarbonates, liquid crystal polymers, and polyimides. Polyimides are preferred. Suitable polyimides include those available under the trade names KAPTON, available from DuPont; APICAL, available from Kaneka Tex. corporation; SKC Kolon PI, available from SKC Kolon PI Inc, and UPILEX and UPISEL including UPILEX S, UPILEX SN, and UPISEL VT, all available from Ube Industries, Japan. These UPILEX and UPISEL polyimides are made from monomers such as biphenyl tetracarboxylic dianhydride (BPDA) and phenyl diamine (PDA). In at least one embodiment, the thickness of the dielectric layer is preferably 50 micrometers or less.

Cavities or vias may be formed in the dielectric substrates using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric substrate material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409791, incorporated herein by reference. Subsequent to etching, the dielectric substrates may be treated with an alkaline KOH/ potassium permanganate (PPM) solution, e.g., a solution of about 0.7 to about 1.0 wt % KOH and about 3 wt % KMnO4.

The side wall angle resulting from chemical etching varies, and is most dependent on etch rate, with slower etching rates resulting in shallower side wall angles, i.e., closer to 0°. Typical side wall angles resulting from chemical etching are about 5° to 60° from the major plane of the dielectric layer, and in at least one embodiment, about 25° to about 28°. As previously mentioned as an alternative to chemical etching, cavities or vias in the dielectric substrate may be formed by punching, plasma etching, focused ion-beam etching, and laser ablation. With these methods of forming a cavity or via, the side walls typically have a steeper angle, e.g., up to 90° from the major plane of the dielectric layer. For purposes of this application, a sloped side wall means a side wall that is not perpendicular to the horizontal plane of the dielectric layer. Cavities or vias with sloped sidewalls could also be made using methods such as embossing, microreplication, and injection molding. If a via is initially formed, but a cavity is desired, a dielectric coating, such as a polyimide coating, may be added to electrically insulate the cavity from a conductive layer on the bottom side of the dielectric substrate, thus forming a cavity. The dielectric material may be any suitable material, e.g., a polymeric material, a ceramic material, a particle-loaded polymeric material, etc. and may be applied in any suitable manner The dielectric coating is electrically insulating and, preferably, thermally conducting to facilitate transfer of heat away from the LESD. One such suitable coating is a polyimide resin formed by first applying a thin layer of polyamic acid resin in the opening. The polyamic acid is preferably precision-coated such that the dielectric coating formed at the bottom of the cavity provides the desired thickness for the cavity floor. The thickness of the cavity floor is preferably about 5% to about 75%, about 5% to about 60%, or about 5% to about 25% of the thickness of the dielectric substrate layer. Subsequently, an imidization process is carried out to form a uniform polyimide coating in the cavity. The polyimide/polyamic acid resin can be applied using precision coating, knife coating, or other methods known in the art.

In some embodiments, the dielectric coating may be filled with particles to enhance its electrically insulating and thermally conducting properties. Suitable particles include aluminum nitride (AlN), aluminum oxide (Al2O3), barium nitride (BN), nanometer-sized silver particles, carbon nanotubes (CNT), fullerenes, graphenes, carbon fillers, barium titanate, barium strontium titanate, titanium oxide, lead zirconium titanate, calcium copper titanate, lead magnesium titanate, lead lanthanium zirconate titanate, silicon dioxide, and mixtures thereof.

The dielectric substrates may be clad on one or both sides with a conductive layer. If the conductive layer(s) are to be formed into circuits, they may be pre-patterned, or may be patterned during the process of making the flexible LES devices. A multilayer flexible substrate (having multiple layers of dielectric and conductive material) may also be used as a substrate. The conductive layers may be any suitable material, but are typically copper.

At least some embodiments of the flexible LES devices of the present invention provide excellent heat management properties. In at least one aspect, due at least in part to the conductive materials in the cavities or vias and thin or absent dielectric floors of the cavities or vias, and in at least one aspect, due at least in part to the thermally conductive material in the vias, and optionally on the first major surface of the dielectric layer, heat generated by the LESDs can be readily transmitted to a thermally conductive layer on the bottom side of the dielectric substrate. In this manner, heat can be readily conducted away from the LESD.

The LESDs can be packaged directly on the flexible substrate, e.g., by applying an encapsulating material over individual LESDs and the conductive features on which they are located, or by applying an encapsulant over an array of LESDs and the conductive layer around such LESDs. The encapsulant is preferably a transparent (i.e., having a transmittance over 99%) molding compound. It may optionally be suitable to act as a lens when cured. Silicones and epoxies are suitable encapsulating compounds. It may further contain optical diffusing particles distributed therein. Suitable molding compounds may be purchased, e.g., from Shin-Etsu Chemical Co., Ltd., of Japan and NuSil Silicone Technology of Santa Barbara, Calif. If desired, a wavelength converting material, such as a phosphor coating, may be deposited on top of the LESD prior to encapsulation. An underfill material may optionally be applied prior to encapsulating the LESD. The flexible LES devices may also be enclosed in a waterproof/weatherproof, transparent casing, which may be made from any suitable polymeric transparent material.

The flexible LES devices can be made in a batch process or a continuous process such as a roll-to-roll process that is often used in making flexible circuits. Arrays of LESDs can be formed in any desired pattern on the flexible substrate. The LESDs can then be divided as desired, e.g., singulated into individual LESDs, strips of LESDs, or arrays of LESDs, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

Before or after forming individual, strips, or arrays of LESDs, the flexible LESDs can be attached to an additional substrate, for example by attaching the conductive layer on the first major surface of the dielectric substrate to the additional substrate with a thermally conductive adhesive. The thermally conductive adhesive can further facilitate the transfer of heat away from the LESD. Alternatively, the conductive layer on the first major surface of the dielectric substrate may be treated with metals or other materials that will facilitate its adhesion to a substrate. The substrate may also be thermally conductive, e.g., a rigid metal strip, or may be a semiconductor or ceramic substrate, which may or may not be electrically conductive.

The flexible LES devices can be attached to any desired substrate, depending on their intended use. For example, they can be attached to flexible or rigid metal substrates, such as copper or aluminum, heat sinks, dielectric substrates, circuit boards, etc. If the LESDs are for use on a circuit board, the flexible LES devices, whether in singulated, strip, or array form can be directly attached to an end user's circuit board, thereby eliminating the need for conventional lead frame materials. If the LESDs are for use as a lighting strip, they could be enclosed in a waterproof/weatherproof, transparent casing, as described above. If the LESDs are in strip or array form, they may be electrically connected to one or more of the other LESDs in the strip or array. Additional elements such as Zener diodes and Schottky diodes can also be added to the flexible substrate prior to be division of the flexible LES devices. These elements may also be electrically connected to the LESDs.

In at least one embodiment, the dielectric substrate and copper layers thereon provide a thin and compliant support for the LESDs. In at least one embodiment, the total thickness of the conductive layers is less than 200 micrometers, preferably less than 100 micrometers, and most preferably less than 50 micrometers. In at least one embodiment, the thickness of the dielectric substrate is preferably 50 micrometers or less.

In at least one embodiment of the present invention a passivation layer can be applied to the bottom of LESD to facilitate die bonding of the LESD to the conductive feature or to an intermediate material such as a reflective layer. Suitable passivation materials include metals such as Au and intermetallic alloy(s) such as AuSn, AuGe, AuSi.

EXAMPLES

This invention is illustrated by the following examples, but the particular materials and amounts thereof recited in these examples, as well as other conditions and details should not be construed to unduly limit this invention.

Etching Method

The general procedure for preparing the etchants included first dissolving 37 wt % potassium hydroxide (KOH) in water by mixing, followed by the subsequent addition of 3.5 wt % ethylene glycol and 22 wt % ethanolamine. Samples of 50 μm polyimide dielectric substrate with 3 lam copper layer clad on one side, available under the trade designation UPISEL-N from Ube-Nitto Kasei Co., Ltd. Industries, Tokyo, Japan, was subjected to selective etching from the PI side using aqueous photoresist, available under the trade designation HM-4056 from Hitachi Chemicals, Japan, as an etch mask. The etching was controlled by timing to create a thin region of polyimide having a bulk thickness, which took approximately 15 minutes.

Example 1

A 20 inch (50.8 cm) wide by 10 m long sample of 50 μm polyimide with 3 μm copper clad on one side, available under the trade designation UPISEL-N from Ube-Nitto Kasei Co., Ltd. Industries, Tokyo, Japan, was first slit into a 13.4 inch (34.04 cm) width. Following removal of the 18 μm copper carrier layer from the polyimide (PI) side, the polyimide was laminated with dry film photoresist, available under the trade designation HM4056 from Hitachi Chemicals, Ltd. on both sides, creating a patterned etch mask on the polyimide side and circuit and pads for LESD mounting pattern mask on the copper (Cu) side using a photolithography process. The sample was then subjected to a semi-additive process which included the deposition of copper having a thickness of about 45 μm using an electroplating process. The sample was then subjected to a chemical etching process using the Etching Method described above for approximately 15-17 minutes to etch the polyimide completely to create an etched via in the polyimide substrate under the patterned pads. Then after the photoresist was removed from both sides, the exposed portions of the 3 μm copper layer were removed to create circuit patterns on the dielectric substrate. This resulted in conductive electrodes and pad for attaching LESDs having a thickness of 45 μm on the polyimide substrate. A thermal interface material (TIM), a boron nitride filled polyimide, was coated directly on the polyimide side of the sample such that the cavity was filled with the TIM. The sample was then subjected to a curing process using the temperature program at the rate of 20° C./minute to 350° C. and allowed to cure at 350° C. for 1 hour.

Following are exemplary embodiments of an article according to aspects of the present invention.

Embodiment 1 is an article comprising: a flexible polymeric dielectric layer having first and second major surfaces, the first major surface having a conductive layer thereon, the dielectric layer having at least one via extending from the second major surface to the first major surface, the conductive layer including electrically separated first and second portions configured to support and electrically connect a light emitting semiconductor device to the conductive layer.

Embodiment 2 is the article of embodiment 1, wherein the conductive layer comprises a circuit.

Embodiment 3 is the article of embodiment 1 further comprising a thermal interface material disposed adjacent the second major surface.

Embodiment 4 is the article of embodiment 1 further comprising a thermal interface material disposed in the at least one via.

Embodiment 5 is the article of embodiment 1, wherein the first and second portions of the conductive layer are electrically separated by a gap.

Embodiment 6 is the article of embodiment 5 further comprising a thermal interface material disposed in the gap.

Embodiment 7 is the article of embodiment 1 further comprising a light emitting semiconductor device supported and electrically connected to the conductive layer on the first major surface by the first and second portions.

Embodiment 8 is the article of embodiment 7, wherein the light emitting semiconductor device is a flip chip die.

Embodiment 9 is the article of embodiment 7, wherein the light emitting semiconductor device is a lateral die.

Embodiment 10 is the article of embodiment 7, wherein the light emitting semiconductor device is flip chip bonded to the conductive layer.

Embodiment 11 is the article of embodiment 7, wherein the light emitting semiconductor device is bonded to the conductive material using a direct die attach method.

Embodiment 12 is the article of embodiment 7 further comprising a thermal interface material disposed between the conductive layer and the light emitting semiconductor device.

Embodiment 13 is an article comprising: a flexible polymeric dielectric layer having first and second major surfaces, the first and second major surfaces each having a conductive layer thereon, the second major surface having at least one cavity therein, the at least one cavity containing a conductive material that is electrically connected to the conductive layer on the second major surface, the conductive layer on the first major surface including electrically separated first and second portions configured to support and electrically connect a light emitting semiconductor device to the conductive layer on the first major surface.

Embodiment 14 is the article of embodiment 13, wherein the conductive material in the cavity is electrically insulated from the first major surface.

Embodiment 15 is the article of embodiment 13, wherein the conductive layer on the first major surface comprises a circuit.

Embodiment 16 is the article of embodiment 13, wherein the conductive layer on the second major surface comprises a circuit.

Embodiment 17 is the article of embodiment 13 further comprising a thermal interface material disposed adjacent the conductive layer on the second major surface.

Embodiment 18 is the article of embodiment 13 further comprising a thermal interface material disposed in the at least one cavity.

Embodiment 19 is the article of embodiment 13, wherein the first and second portions of the conductive layer on the first major surface are electrically separated by a gap.

Embodiment 20 is the article of embodiment 19 further comprising a thermal interface material disposed in the gap.

Embodiment 21 is the article of embodiment 13, wherein the conductive material completely fills the at least one cavity.

Embodiment 22 is the article of embodiment 13, wherein the conductive material includes electrically separated first and second portions.

Embodiment 23 is the article of embodiment 22, wherein the first and second portions of the conductive material are electrically separated by a gap.

Embodiment 24 is the article of embodiment 23 further comprising a thermal interface material disposed in the gap.

Embodiment 25 is the article of embodiment 13 further comprising a light emitting semiconductor device supported and electrically connected to the conductive layer on the first major surface by the first and second portions.

Embodiment 26 is the article of embodiment 25, wherein the light emitting semiconductor device is a flip chip die.

Embodiment 27 is the article of embodiment 25, wherein the light emitting semiconductor device is a lateral die.

Embodiment 28 is the article of embodiment 25, wherein the light emitting semiconductor device is flip chip bonded to the conductive layer on the first major surface.

Embodiment 29 is the article of embodiment 25, wherein the light emitting semiconductor device is bonded to the conductive material using a direct die attach method.

Embodiment 30 is the article of embodiment 25 further comprising a thermal interface material disposed between the conductive layer and the light emitting semiconductor device.

Embodiment 31 is a flexible article comprising: a polymeric dielectric layer having a first major surface with a first electrically conductive layer thereon and having a second major surface, the dielectric layer having at least one cavity extending from the second major surface toward the first major surface, the first electrically conductive layer comprising an electrically conductive feature substantially aligned with the cavity, and a light emitting semiconductor device supported by the electrically conductive feature.

Embodiment 32 is a flexible article comprising: a polymeric dielectric layer having a first major surface with a first electrically conductive layer thereon and having a second major surface, the dielectric layer having at least one via extending from the second major surface to the first major surface, the first electrically conductive layer comprising an electrically conductive feature substantially aligned with the via, and a light emitting semiconductor device supported by the electrically conductive feature.

Embodiment 33 is the article of embodiment 31 or 32, wherein the conductive feature comprises electrically separated first and second portions supporting and electrically connecting the light emitting semiconductor device to the conductive layer on the first major surface.

Embodiment 34 is the article of embodiment 31, 32, or 33 further comprising a second electrically conductive layer on the second major surface of the dielectric layer.

Embodiment 35 is the article of embodiment 34, wherein the electrically conductive layer is also thermally conductive.

Embodiment 36 is the article of any one of embodiments 31 to 34, wherein the cavity or via contains thermally conductive material.

Embodiment 37 is the article of embodiment 36, wherein the thermally conductive material is also electrically conductive and comprises electrically separated first and second portions.

Embodiment 38 is the article of embodiment 35 or 36, wherein the thermally conductive material fills at least 10% of the cavity or via.

Embodiment 39 is the article of embodiment 37 or 38, wherein the first and second portions of the electrically conductive material are electrically separated by a gap.

Embodiment 40 is the article of embodiment 39 further comprising a thermal interface material disposed in the gap.

Embodiment 41 is the article of embodiment 39 further comprising a thermal interface material disposed in the gap and the via.

Embodiment 42 is the article of embodiment 40 or 41 further comprising a thermal interface material surrounding the base of the LESD.

Embodiment 43 is the article of embodiment 31 or 32, wherein the thermal interface material and the second major surface are attached to a thermally conductive substrate.

Embodiment 44 is the article of embodiment 31 or 32, wherein the thermal interface material and the second major surface are attached to a thermally conductive substrate by a thermally conductive adhesive.

Embodiment 45 is the article of embodiment 36 further comprising a thermal interface layer abutting the second major surface and the thermally conductive material in the cavities or vias.

Embodiment 46 is the article of embodiment 45, wherein the thermal interface layer is attached to a thermally conductive substrate.

Embodiment 47 is the article of embodiment 46, wherein the thermal interface layer is attached to a thermally conductive substrate by a thermally conductive adhesive.

Embodiment 48 is the article of embodiment 31 or 32, wherein the dielectric layer has an array of cavities or vias.

Embodiment 49 is the article of embodiment 31 or 32, wherein the first conductive layer comprises a circuit.

Embodiment 50 is the article of embodiment 31 or 32, wherein the at least one cavity or via has walls that slope from the second major surface toward the first major surface of the dielectric layer at an angle of about 5° to about 60° from normal.

Embodiment 51 is the article of embodiment 31 or 32, wherein the light emitting semiconductor device is a bare die LES construction.

Embodiment 52 is the article of embodiment 31 or 32, wherein the light emitting semiconductor device is an intermediate LES construction.

Embodiment 53 is the article of embodiment 31 or 32, wherein the light emitting semiconductor device is a complete packaged LES construction.

Embodiment 54 is an article comprising: a flexible dielectric layer having a first major surface with a first conductive layer thereon and having a second major surface, the dielectric layer having at least one cavity, or via, extending from the second major surface toward, or to, the first major surface, the at least one cavity, or via, containing conductive material, the first conductive layer comprising a conductive feature substantially aligned with the cavity, or via, and conductive pads disposed adjacent the conductive feature.

Embodiment 55 is an article comprising: a flexible dielectric layer having a first major surface with a first conductive layer thereon and having a second major surface, the dielectric layer having three cavities, or vias, extending from the second major surface toward, or to, the first major surface, the three cavities, or vias, containing conductive material, the first conductive layer comprising a conductive feature substantially aligned with one cavity, or via, and conductive pads disposed adjacent the conductive feature and substantially aligned with the other two cavities, or vias.

Embodiment 56 is an article comprising: a flexible dielectric layer having a first major surface with a first conductive layer thereon and having a second major surface, the dielectric layer having two cavities, or vias, extending from the second major surface toward, or to, the first major surface, the two cavities, or vias, containing conductive material, the first conductive layer comprising a conductive pad substantially aligned with each cavity, or via.

Embodiment 57 is an article comprising: a flexible dielectric layer having a first major surface with a first conductive layer thereon and having a second major surface, the dielectric layer having one cavity and one via, extending from the second major surface toward, or to, the first major surface, the cavity and via containing conductive material, the first conductive layer comprising a conductive pad substantially aligned with each of the cavity and the via.

Embodiment 58 is an article comprising: a flexible dielectric layer having a first major surface with a first conductive layer thereon and having a second major surface, the dielectric layer having one cavity, or via, extending from the second major surface toward, or to, the first major surface, the cavity, or via, containing conductive material, the first conductive layer comprising two conductive pads, one of which is substantially aligned with the cavity, or via.

Embodiment 59 is an article comprising: a flexible dielectric layer having a first major surface with a first conductive layer thereon and having a second major surface with a second conductive layer thereon, the dielectric layer having two cavities, or vias, extending from the second major surface toward, or to, the first major surface; the second conductive layer extending into the two cavities, or vias; the two cavities, or vias, optionally containing conductive material; and the first conductive layer comprising a conductive pad substantially aligned with each of the cavities, or vias.

Following are exemplary embodiments of a method according to aspects of the present invention.

Embodiment 1 is a method comprising: providing a flexible dielectric layer having a first major surface and a second major surface; creating a conductive layer on the first major surface, the conductive layer including electrically separated first and second portions; creating at least one via extending from the second major surface to the first major surface; and placing a light emitting semiconductor device on the conductive layer and bonding it to the first and second portions.

Embodiment 2 is a method comprising: providing a flexible dielectric layer having a first major surface and a second major surface; creating a conductive layer on the first and second major surfaces, the conductive layer on the first major surface including electrically separated first and second portions; creating at least one cavity in the second major surface; applying a conductive material in the at least one cavity such that the conductive material is in electrical contact with the conductive layer on the second major surface; and placing a light emitting semiconductor device on the conductive layer on the first major surface and bonding it to the first and second portions.

Embodiment 3 is the method of any one of embodiments 1 to 2, wherein bonding the light emitting semiconductor device includes flip chip bonding.

Embodiment 4 is the method of any one of embodiments 1 to 2, wherein bonding the light emitting semiconductor device includes bonding using a direct die attach method.

Embodiment 5 is the method of any one of embodiments 1 to 2 further comprising applying a thermal interface material.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. An article comprising:
a flexible polymeric dielectric layer having first and second major surfaces, a first plane comprising the first major surface, the first major surface having a conductive layer directly thereon, the dielectric layer having at least one via extending from the second major surface to the first major surface, the conductive layer including electrically separated first and second portions, each of the first and second portions configured to support and electrically connect a light emitting semiconductor device to the conductive layer, at least some of the vias in the at least one via having sloped side walls, the sloped side walls having side wall angles from about 5 degrees to about 60 degrees from the first plane.

2. The article of claim 1, further comprising a thermal interface material disposed in the at least one via.

3. The article of claim 1 further comprising a light emitting semiconductor device supported and electrically connected to the conductive layer on the first major surface by the first and second portions.

4. The article of claim 1, wherein the first and second portions of the conductive layer on the first major surface are electrically separated by a gap, and further comprising a thermal interface material disposed in the gap.

5. A flexible article comprising:
a polymeric dielectric layer having a first major surface with a first electrically conductive layer directly thereon and having a second major surface, a first plane comprising the first major surface, a second plane comprising the second major surface, the dielectric layer disposed within a region between the first and second planes, the dielectric layer having at least one via extending from the second major surface to the first major surface, the first electrically conductive layer comprising an electrically conductive feature substantially aligned with the via, and a light emitting semiconductor device supported by the electrically conductive feature, the light emitting semiconductor device disposed outside the region between the first and second planes, wherein at least some of the vias in the at least one via have sloped side walls, the sloped side walls having side wall angles from about 5 degrees to about 60 degrees from the first plane.

6. The article of claim 5, wherein the conductive feature comprises electrically separated first and second portions supporting and electrically connecting the light emitting semiconductor device to the conductive layer on the first major surface.

7. The article of claim 5 further comprising a second electrically conductive layer on the second major surface of the dielectric layer.

8. The article of claim 5, wherein the at least one via contains thermally conductive material.

9. The article of claim 5, further comprising a thermal interface layer abutting the second major surface and the thermally conductive material in the at least one via.

10. An article comprising:
a flexible dielectric layer having a first major surface with a first conductive layer directly thereon and having a second major surface, a first plane comprising the first major surface, the dielectric layer having at least one via extending from the second major surface to the first major surface, each via in the at least one via filled with conductive material, the first conductive layer comprising a conductive feature substantially aligned with the at least one via, and the first conductive layer further comprising conductive pads disposed adjacent the conductive feature, wherein at least some of the vias in the at least one via have sloped side walls, the sloped side walls having side wall angles from about 5 degrees to about 60 degrees from the first plane.

11. The article of claim 10, wherein the at least one via comprises two vias, the first conductive layer comprising a conductive pad substantially aligned with each via.

* * * * *

UNITED STATES PATENT AND TRADEMARK OFFICE
CERTIFICATE OF CORRECTION

PATENT NO. : 9,716,061 B2
APPLICATION NO. : 13/985096
DATED : July 25, 2017
INVENTOR(S) : Ravi Palaniswamy It is certified that error appears in the above-identified patent and that said Letters Patent is hereby corrected as shown below:

In the Specification

Column 1
Line 2; Delete "semi-conductor" and insert -- semiconductor --, therefor.

Column 5
Line 23; Delete ""front"" insert -- "front," --, therefor.

Column 8
Line 34-49; Delete "LESD 22 to an underlying layer. In at least one embodiment, conductive substrate 40 is attached to the flexible LES device adjacent the second major surface of dielectric layer 12, which brings it into contact with the TIM 30 in via 10. Conductive substrate 40 may be any material that is thermally conductive. For example, conductive substrate may be a metal strip, e.g., of copper or aluminium, a heat sink, or other heat transferring or heat absorbing material. Conductive substrate 40 may be attached to the flexible LES device using a thermally conductive adhesive. The juxtaposition of conductive feature 21, TIM 30 in via 10, and conductive substrate 40 allows for efficient dissipation of heat generated by the LESD to conductive substrate 40. In addition, the TIM in via 10 can provide mechanical support for conductive feature 21, which is essentially suspended over the opening of via 10." and insert the same on Column 8, Line 33 as a continuation of the same paragraph.

Column 16
Line 7; After "manner" insert -- . --.

Signed and Sealed this
Tenth Day of April, 2018

Andrei Iancu
*Director of the United States Patent and Trademark Office*